(12) United States Patent
Wang

(10) Patent No.: US 9,377,490 B2
(45) Date of Patent: Jun. 28, 2016

(54) SMART METER VOLTAGE SENSING USING OPTICALLY COUPLED ISOLATORS

(71) Applicant: International Technological University, San Jose, CA (US)

(72) Inventor: Karl L. Wang, Los Altos, CA (US)

(73) Assignee: INTERNATIONAL TECHNOLOGICAL UNIVERSITY, San Jose, CA (US)

( * ) Notice: Subject to any disclaimer, the term of this patent is extended or adjusted under 35 U.S.C. 154(b) by 0 days.

(21) Appl. No.: 14/603,221

(22) Filed: Jan. 22, 2015

(65) Prior Publication Data

US 2016/0011236 A1 Jan. 14, 2016

Related U.S. Application Data

(62) Division of application No. 14/330,765, filed on Jul. 14, 2014, now Pat. No. 9,000,753.

(51) Int. Cl.
*G01R 15/22* (2006.01)
*G01R 15/14* (2006.01)
*G01R 19/00* (2006.01)

(52) U.S. Cl.
CPC ............... *G01R 15/22* (2013.01); *G01R 15/14* (2013.01); *G01R 19/0084* (2013.01)

(58) Field of Classification Search
CPC .. G01R 21/133; G01R 22/066; G01R 22/063; G01R 31/362; G01R 31/3648; G01R 21/127; G01R 22/10; G01R 19/252; G01R 21/1331; G01R 22/00; G01R 23/15; G01R 31/3658; G01R 13/00; G01R 21/14; G01R 15/22; G01R 19/16547; G01R 35/04; G01R 15/14; G01R 19/0084; G01D 1/18; G02F 2001/133616; G02F 1/163; G01C 19/721; G06F 11/002; G06F 11/14; G06F 11/16
See application file for complete search history.

(56) References Cited

U.S. PATENT DOCUMENTS

| | | | |
|---|---|---|---|
| 3,152,250 A | 10/1964 | Platzer, Jr. | |
| 4,417,099 A | 11/1983 | Pierce | |
| 4,437,059 A * | 3/1984 | Hauptmann | G01R 21/133 324/107 |
| 4,896,106 A * | 1/1990 | Voisine | G01R 21/14 324/107 |
| 5,325,048 A | 6/1994 | Longini | |
| 5,450,007 A | 9/1995 | Payne et al. | |
| 5,773,978 A * | 6/1998 | Becker | G01R 31/3662 324/430 |
| 6,665,620 B1 * | 12/2003 | Burns | G01D 4/002 340/870.02 |

(Continued)

FOREIGN PATENT DOCUMENTS

| | | |
|---|---|---|
| GB | 1542290 | 3/1979 |
| WO | WO9624070 | 8/1996 |

OTHER PUBLICATIONS

The International Search Report and the Written Opinion of the International Searching Authority issued for International Application No. PCT/US2015/040218, mailed on Jan. 6, 2016.

(Continued)

*Primary Examiner* — Vinh Nguyen
(74) *Attorney, Agent, or Firm* — Sawyer Law Group, P.C.

(57) ABSTRACT

A transformer-less method and system for voltage and current sensing using voltage drops across resistors is disclosed. Using optically coupled isolators, the sensed voltages in the high voltage power lines are optically coupled and electrically isolated to the low voltage circuits. The circuit designs for voltage and current sensing's and electrical isolation are disclosed.

14 Claims, 7 Drawing Sheets

(56) References Cited

U.S. PATENT DOCUMENTS

| | | | |
|---|---|---|---|
| 7,421,205 | B2 | 9/2008 | Ramirez |
| 7,768,424 | B2 | 8/2010 | Harvey et al. |
| 8,228,209 | B2 | 7/2012 | Smith |
| 8,234,017 | B2 | 7/2012 | Ahn |
| D668,983 | S | 10/2012 | Manion et al. |
| 8,466,803 | B2 | 6/2013 | Jonsson et al. |
| 8,509,109 | B2 | 8/2013 | Guo et al. |
| 8,587,290 | B2 | 11/2013 | Pamulaparthy et al. |
| 8,593,135 | B2 | 11/2013 | Chemel et al. |
| 8,654,711 | B2 | 2/2014 | Guo et al. |
| D701,784 | S | 4/2014 | Manion et al. |
| 8,750,100 | B2 | 6/2014 | Guo et al. |
| 2004/0254750 | A1 | 12/2004 | Macfarlene et al. |
| 2007/0016539 | A1 | 1/2007 | Groft et al. |
| 2008/0042873 | A1 | 2/2008 | Harvey et al. |
| 2008/0048883 | A1 | 2/2008 | Boaz |
| 2009/0034418 | A1 | 2/2009 | Flammer |
| 2009/0135018 | A1 | 5/2009 | Veillette et al. |
| 2009/0198384 | A1 | 8/2009 | Ahn |
| 2010/0039263 | A1 | 2/2010 | Chen et al. |
| 2010/0131329 | A1 | 5/2010 | An et al. |
| 2010/0253538 | A1 | 10/2010 | Smith |
| 2011/0049984 | A1 | 3/2011 | Son |
| 2011/0279353 | A1 | 11/2011 | Son et al. |
| 2011/0283060 | A1 | 11/2011 | Ware et al. |
| 2012/0026715 | A1 | 2/2012 | Manion et al. |
| 2012/0083937 | A1 | 4/2012 | Kong |
| 2012/0123709 | A1 | 5/2012 | Chen et al. |
| 2012/0124367 | A1 | 5/2012 | Ota |
| 2012/0131324 | A1 | 5/2012 | Ansari et al. |
| 2012/0137126 | A1 | 5/2012 | Matsuoka et al. |
| 2012/0200424 | A1 | 8/2012 | Nishizawa et al. |
| 2012/0231828 | A1 | 9/2012 | Wang et al. |
| 2012/0249121 | A1 | 10/2012 | Pamulaparthy et al. |
| 2012/0280832 | A1 | 11/2012 | Jonsson et al. |
| 2012/0280833 | A1 | 11/2012 | Jonsson et al. |
| 2012/0287596 | A1 | 11/2012 | Manion et al. |
| 2012/0327792 | A1 | 12/2012 | Guo et al. |
| 2013/0015716 | A1 | 1/2013 | Matsushima et al. |
| 2013/0057367 | A1 | 3/2013 | Smith |
| 2013/0077610 | A1 | 3/2013 | Amini et al. |
| 2013/0079938 | A1 | 3/2013 | Lee et al. |
| 2013/0208583 | A1 | 8/2013 | Guo et al. |
| 2013/0223334 | A1 | 8/2013 | Guo et al. |
| 2013/0262844 | A1 | 10/2013 | Hester |
| 2013/0300576 | A1 | 11/2013 | Sinsuan et al. |
| 2014/0039699 | A1 | 2/2014 | Forbes |
| 2014/0156093 | A1 | 6/2014 | Brian et al. |
| 2014/0167979 | A1 | 6/2014 | Soma et al. |
| 2014/0277788 | A1 | 9/2014 | Forbes, Jr. |

OTHER PUBLICATIONS

The International Search Report and the Written Opinion of the International Searching Authority issued for International Application No. PCT/US2015/040213, mailed on Oct. 30, 2015.

The International Search Report and the Written Opinion of the International Searching Authority issued for International Application No. PCT/US2015/040201, mailed on Dec. 28, 2015.

\* cited by examiner

*Figure 7*
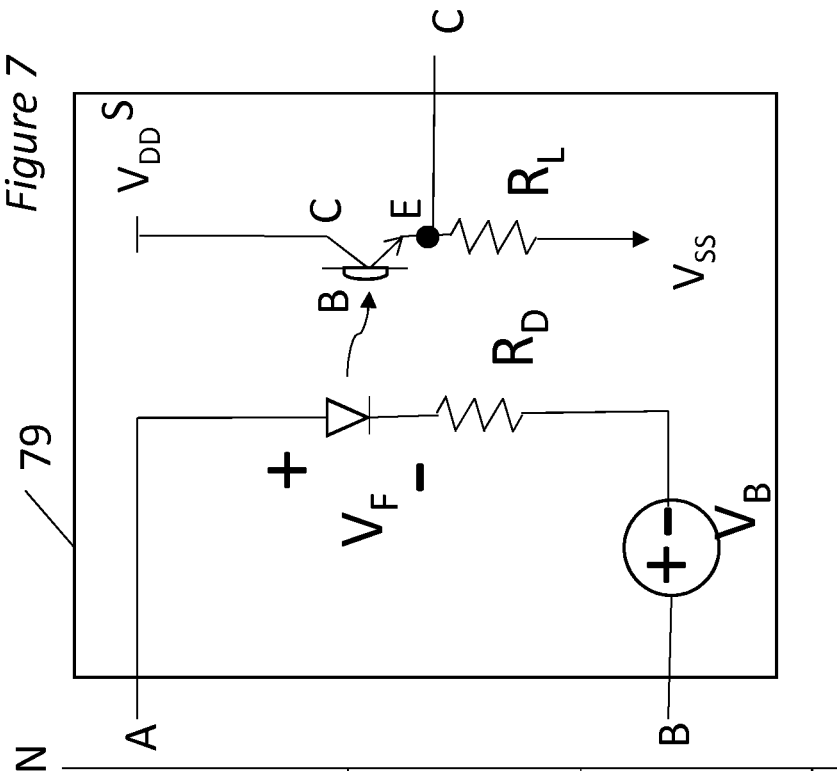
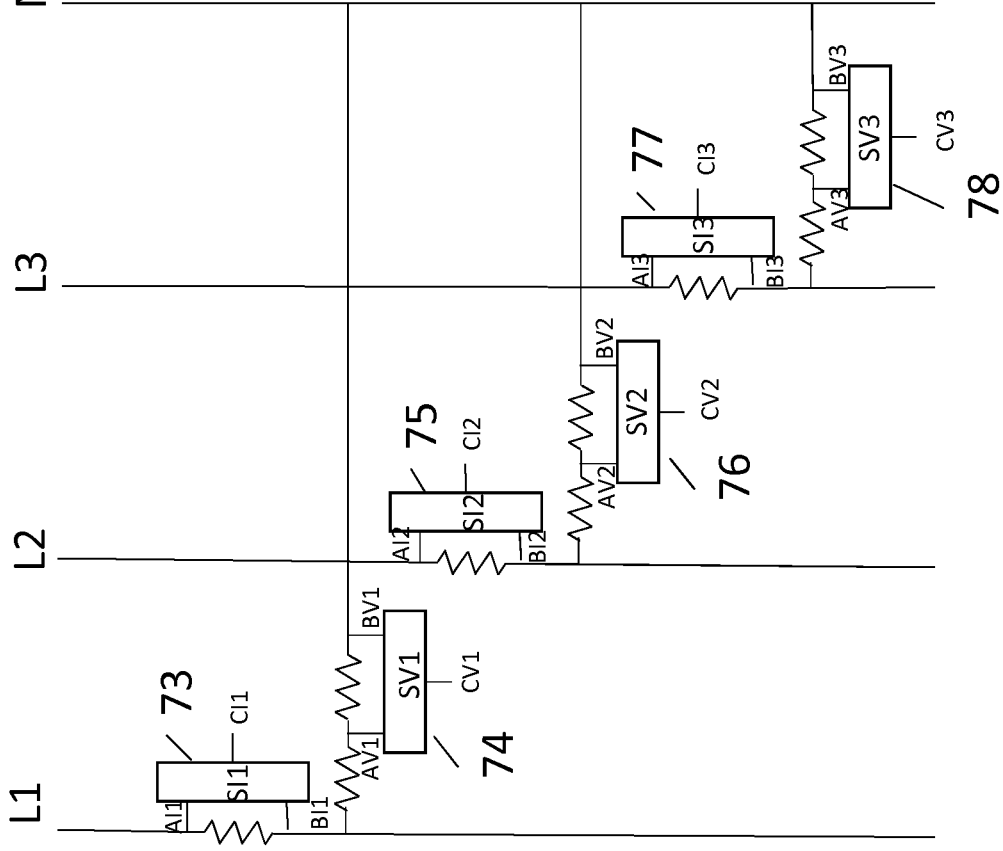

SMART METER VOLTAGE SENSING USING OPTICALLY COUPLED ISOLATORS

CROSS-REFERENCE TO RELATED APPLICATION

Under 35 U.S.C. 120, this application is a Divisional Application and claims priority to Ser. No. 14/330,765, filed on Jul. 14, 2014, now U.S. Pat. No. 9,000,753, entitled "SMART METER VOLTAGE AND CURRENT SENSING USING OPTICALLY COUPLED ISOLATORS", which is incorporated herein by reference.

FIELD OF THE INVENTION

The present invention is related generally to meters for measuring power and more particularly to a smart meter system.

BACKGROUND

In smart meter system voltage and current sensing, electrical isolation between the high voltage and the low voltage domains is necessary. One common way to achieve that is to use voltage and current transformers. The average power dissipated in resistive loads, e.g. household appliances, can be calculated as the product of root-mean-squares of current and voltage averaged over a time period. But for non-resistive loads, such as AC motors, the average AC power can be calculated by the direct product of current and voltage averaged over a period of time. Since the voltage induced across a transformer is proportional to the rate of change of current, a direct measurement of the current cannot be easily done directly from the outputs of a current transform. On the other hand, a direct current sensing can be easily done by measuring the voltage drop across a small shut resistor connected in series with the power line. Another advantage of using resistors and optically coupled isolators is the fact that voltage and current sensing's cannot be tampered as in the case of transformers by placing a strong external magnets in the close proximity as to saturate the transformer cores. In addition, the transformer-less approach is the smaller size as compared with that of transformers to enable a compact form factor design. Furthermore, the cost of resistors and isolators are less as compared to that of the transformers.

There is a need to enhance system performance, reliability, testability and manufacturability of the smart meter during the product production and prototyping. Accordingly, what is needed is a system and method that addresses such needs. The system and method must be easily implemented, cost effective and adaptable to existing systems. The present invention addresses such a need.

SUMMARY

A transformer-less method and system for voltage and current sensing using voltage drops across resistors is disclosed. Using optically coupled isolators, the sensed voltages in the high voltage power lines are optically coupled and electrically isolated to the low voltage circuits. The circuit designs for voltage and current sensing's and electrical isolation are disclosed.

In a first aspect a method of sensing current within a smart meter is disclosed. The method includes coupling at least one resistor to a high voltage portion of the smart meter. The method also includes optically coupling the high voltage portion to a low voltage portion of the smart meter.

In a second aspect, a method of sensing voltage within a smart meter is disclosed. The method includes coupling a resistor voltage divider to a high voltage portion of the smart meter. The method also includes optically coupling the high voltage portion to a low voltage portion of the smart meter.

BRIEF DESCRIPTION OF THE DRAWINGS

FIG. 7 is an illustration of circuit for voltage and current sensing for the emitter follower configuration for a 3-phase power line application.

DETAILED DESCRIPTION

The present invention is related generally to meters for measuring power and more particularly to a smart meter system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
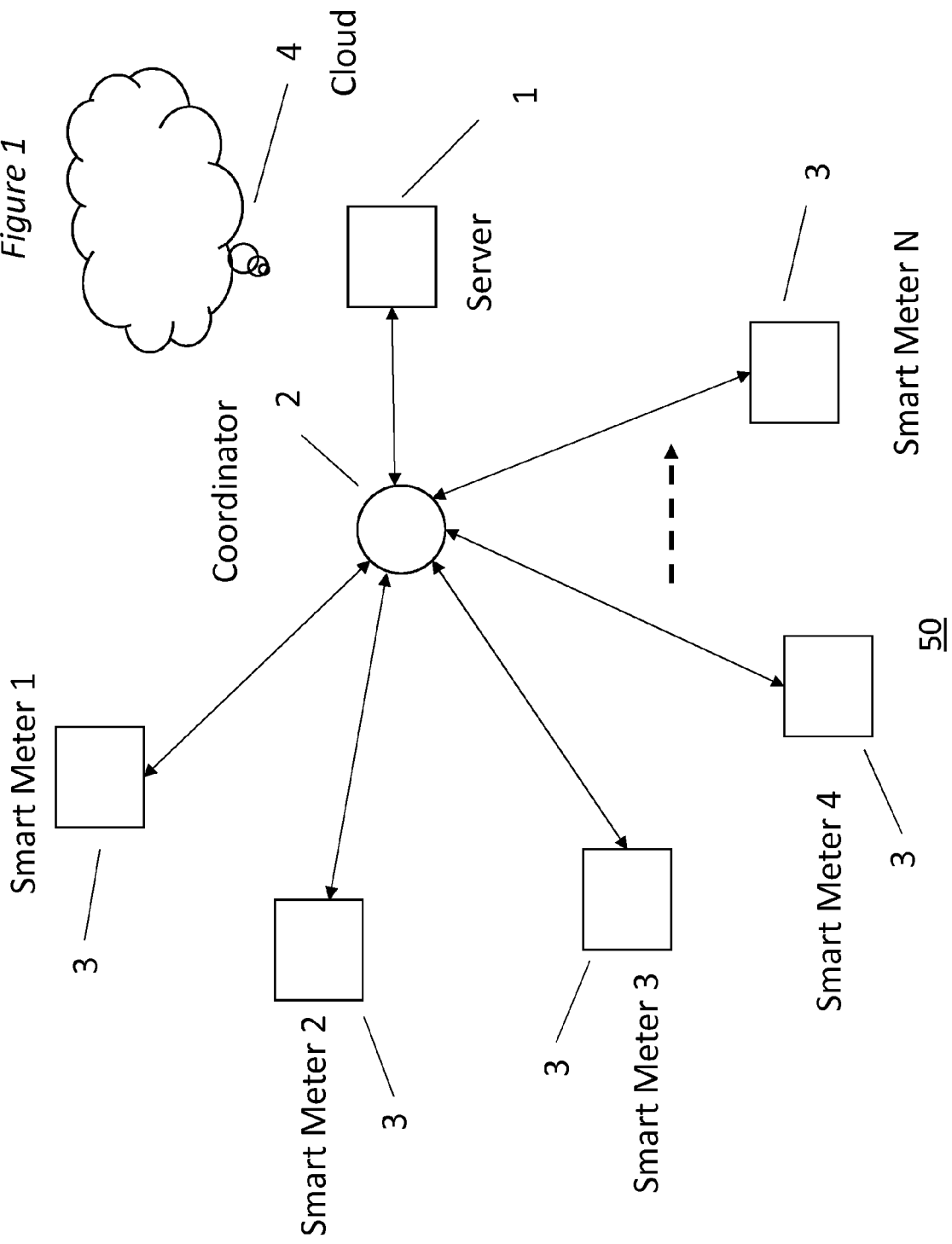
FIG. 1 is an illustration of smart meter system.

FIG. 1 is an illustration of the smart meter system 50 in accordance with an embodiment. The smart meter system 50 comprises a local server 1 connected to a coordinator 2 and smart meters 3 (smart meter 1-N). In one embodiment, the local server 1 is connected to the coordinator 2 via wires. In another embodiment, the local server 1 is connected to the coordinator 2 wirelessly.

The smart meter system 50 is a many-to-one data communication topology. In this embodiment, the local server 1 issues a command to the coordinator 2 which executes the command by sending a corresponding data packet wirelessly to the smart meters 3 by a radio frequency (RF) link, e.g. ZigBee that may or may not support an industry standard such as IEEE 802.14.5. Then the smart meters 3 send an appropriate response back to the coordinator 2 by the same RF link. Power usage data sent by the smart meters 3 can be stored in a database hosted in the local server 1 or an internet cloud 4.

The power usage can be accessed for example by displaying web pages using any device that is connected to the local server or the internet. The database can be analyzed to determine optimal power usage and distribution. The power usage can also be analyzed to enable system control, e.g. cut off the power if necessary.

The local server 1 issues commands to the coordinator 2 through a coordinator-server interface control register. The coordinator server interface control register typically resides within the coordinator 2 and allows for the communication between the local sever 1 and the coordinator 2. The coordinator server interface control register streamlines and enhances the performance of tasks between server 1 and coordinator 2.

Figure 2:
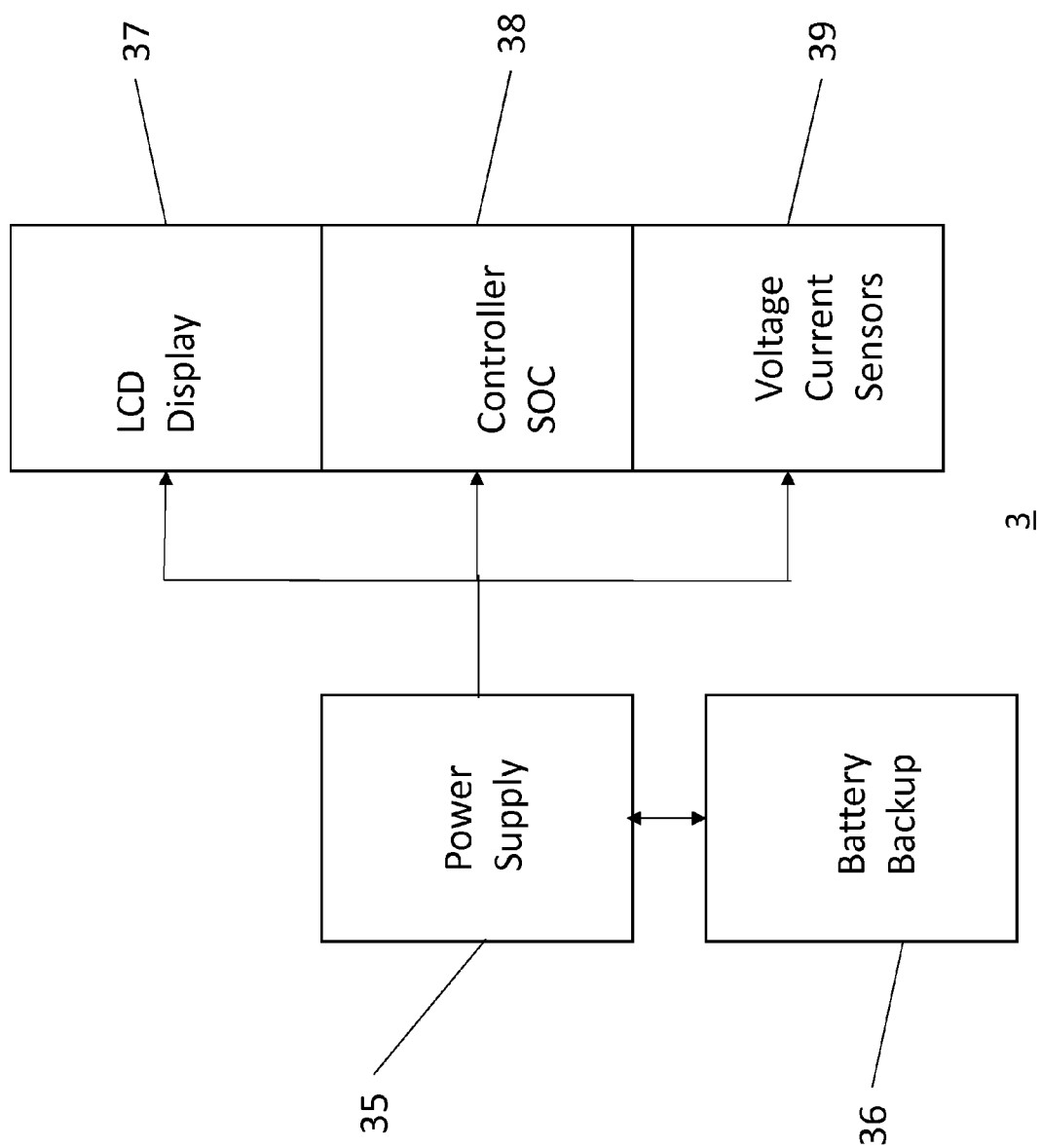
FIG. 2 is an illustration of a smart meter in accordance with an embodiment.

FIG. 2 is an illustration of a smart meter 3 in accordance with an embodiment. The smart meter 3 comprises a power supply 35, a battery backup 36, a liquid crystal display or LCD display 37, a RF controller System-on-Chip (SOC) 38, and voltage and current sensors 39. The battery backup 36 provides a non-interruptible power supply in the event of a power failure. The battery backup 36 enables the detection of power failure in the smart meter 3. The status of the battery backup 36 is reported in the STATUS register.

A key feature of the present invention is that there is no need for a transformer when sensing voltage and current. This is made possible by optically isolating a high voltage portion of the smart meter from a low voltage portion. In so doing, resistors can be utilized to provide the current or voltage sensing properties of the smart meter. By eliminating the transformer the smart meter can be physically smaller, less costly and will not be tampered as in the case when the transformer core is placed in a saturation condition. To describe the features of the present invention in more detail refer now to the following description in conjunction with the accompanying Figures.

Figure 3:
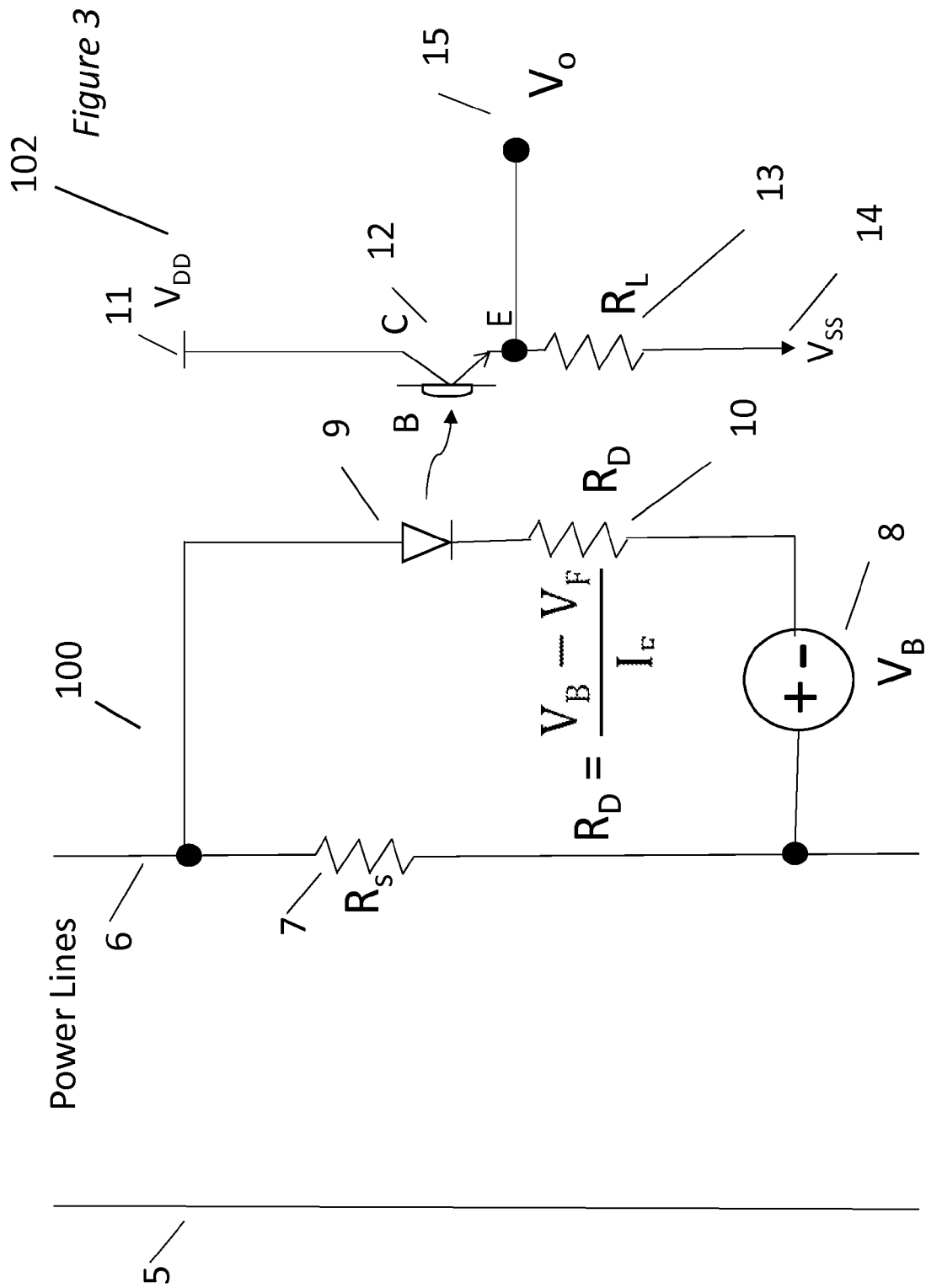
FIG. 3 is an illustration of circuit design for current sensing transistor in an emitter follower configuration with load resistor connected to the emitter.

FIG. 3 is an illustration of circuit design for a current sensing portion of voltage and current sensors 39 in the smart meter 3 of FIG. 2 for a single-phase power line system. The first terminal of a small shunt resistor $R_S$ 7 is connected in series with the hot line of power line pair 6 which is a high voltage portion 100; the other power line 5 is the neutral or ground line. The cathode terminal of an infra-red (IR) LED 9 is connected to the first terminal of resistor $R_S$. The anode terminal of IR LED is connected with the first terminal of resistor $R_D$ 10. The second terminal of $R_D$ 10 is connected to the negative terminal of a voltage source $V_B$ 8. The positive terminal of $V_B$ is connected to the second terminal of $R_S$ 7.

An optical transistor 12 has a base terminal B that is optically coupled to the IF LED which is a low voltage portion 102. The collector terminal C is connected to the $V_{DD}$ terminal 11. The emitter terminal E is connected to the first terminal of a resistor $R_L$ 13 in an emitter follower configuration. The second terminal of $R_L$ 13 is connected to the $V_{SS}$ terminal 14. An output signal $V_O$ 15 is connected to the emitter terminal E of the optical transistor 12. The optically coupled isolator comprises of the IR LED 9 and the optical transistor 12.

The IF LED 9 is biased in the forward conduction region using a voltage source $V_B$ 8. This bias condition is determined by choosing a current-limiting resistor $R_D$ 10 that is equal to the difference of bias voltage source $V_B$ 8 and the forward voltage $V_F$ of the IR LED diode divided by the forward current IF of the IR LED diode. This bias condition enables the IR LED diode to operate at a voltage bias condition to maximize the sensitivity of the optically coupled isolator and minimize the current consumption.

Figure 4:
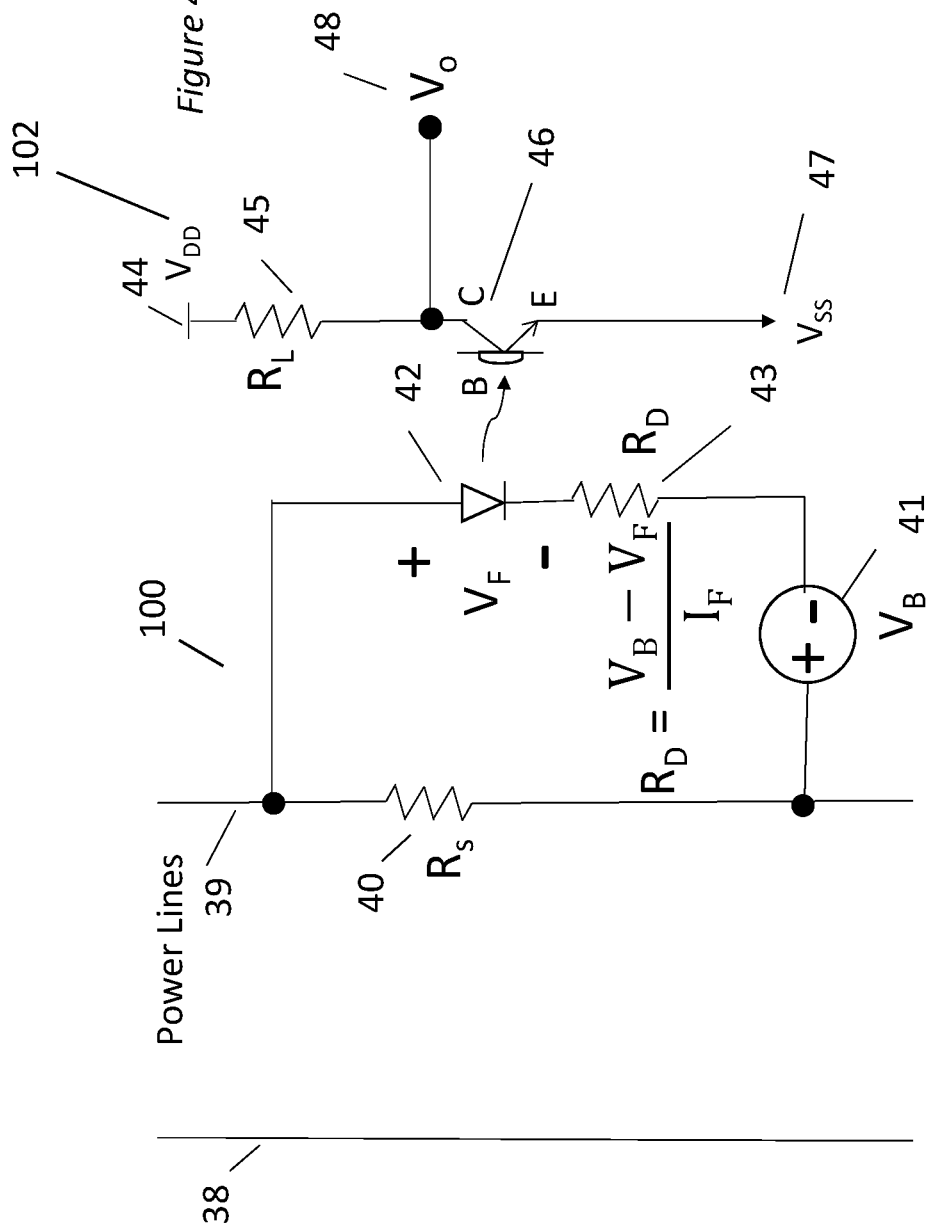
FIG. 4 is an illustration of circuit for current sensing for the open collector configuration with a load resistor connected to the collector.

FIG. 4 is an illustration of the output transistor in the open collector configuration with a load resistor $R_L$ 45. The first terminal of $R_L$ 45 is connected to $V_{DD}$ and the second terminal of $R_L$ 45 is connected to the collector terminal C of the optical transistor 46. The output voltage $V_O$ 48 is taken from the collector terminal C of the optical transistor 46.

Figure 5:
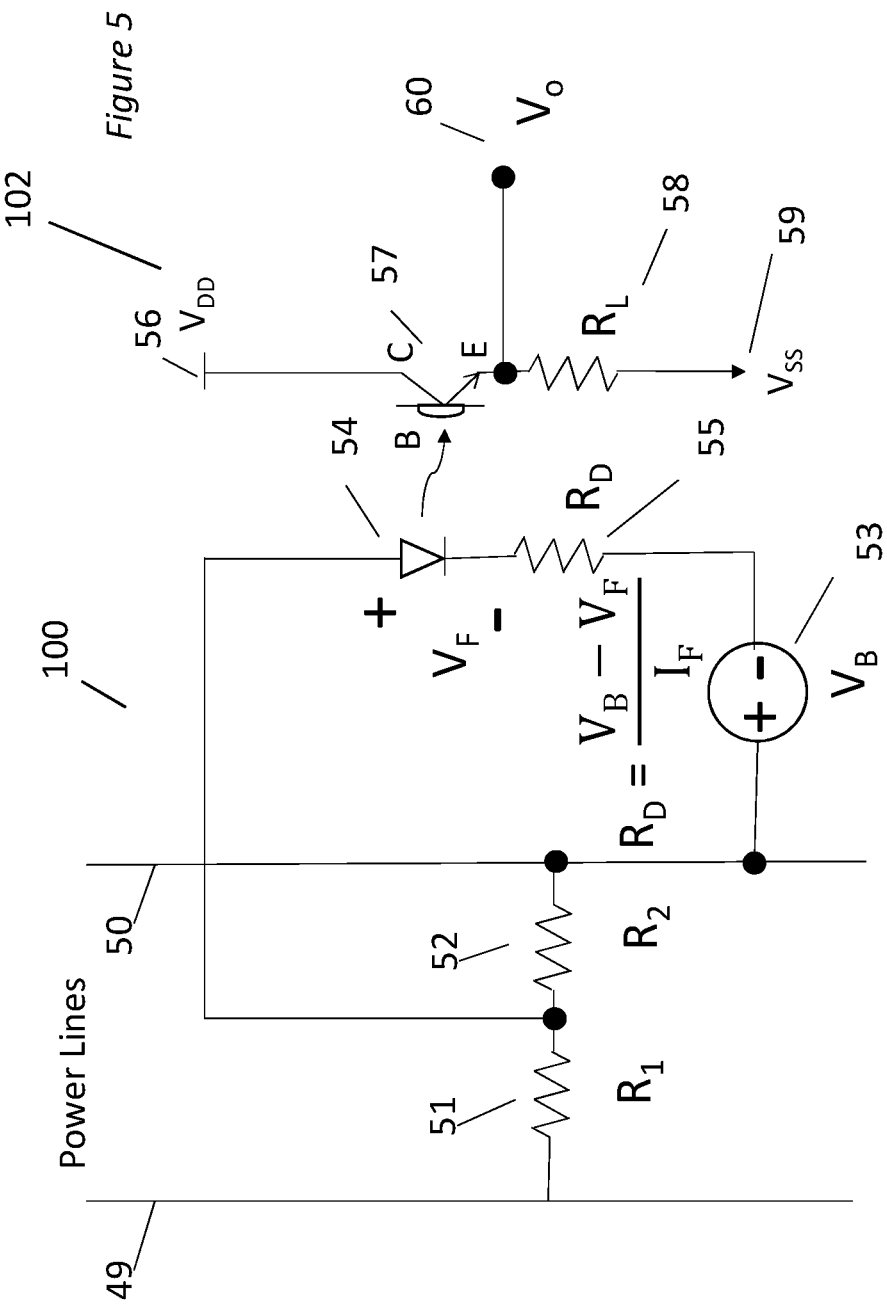
FIG. 5 is an illustration of circuit for voltage sensing transistor in an emitter follower configuration with a load resistor connected to the emitter.

FIG. 5 is an illustration of circuit for voltage sensing transistor in the emitter follower configuration with a load resistor $R_L$ 58. The voltage sensing circuit comprises of a voltage divider comprising resistor $R_1$ 51 and $R_2$ 52 that are connected in series across the hot power lines 49 and the neutral power line 50 where the first terminal of $R_1$ 51 is connected to the hot power lines 49, the second terminal of $R_1$ 51 is connected to the first terminal of $R_2$ 52, and the second terminal of $R_2$ 52 is connected to the neutral power line 50 which is a high voltage portion 100. The first terminal of resistor $R_2$ 52 is connected to the cathode terminal of the IR LED 54. The anode terminal of IR LED 54 is connected to the first terminal of resistor $R_D$ 55. The second terminal of $R_D$ 55 is connected to the negative terminal of a voltage source $V_B$ 53. The positive terminal of $V_B$ 53 is connected to the second terminal of $R_2$ 52.

An optical transistor 57 has a base terminal B that is optically coupled to the IF LED which is a low voltage portion 102. The collector terminal C is connected to the $V_{DD}$ terminal 56. The emitter terminal E is connected to the first terminal of a resistor $R_L$ 58 in the emitter follower configuration. The second terminal of $R_L$ 58 is connected to the $V_{SS}$ terminal 59. The output voltage $V_O$ is taken from the emitter terminal E of the optical transistor 57.

Figure 6:
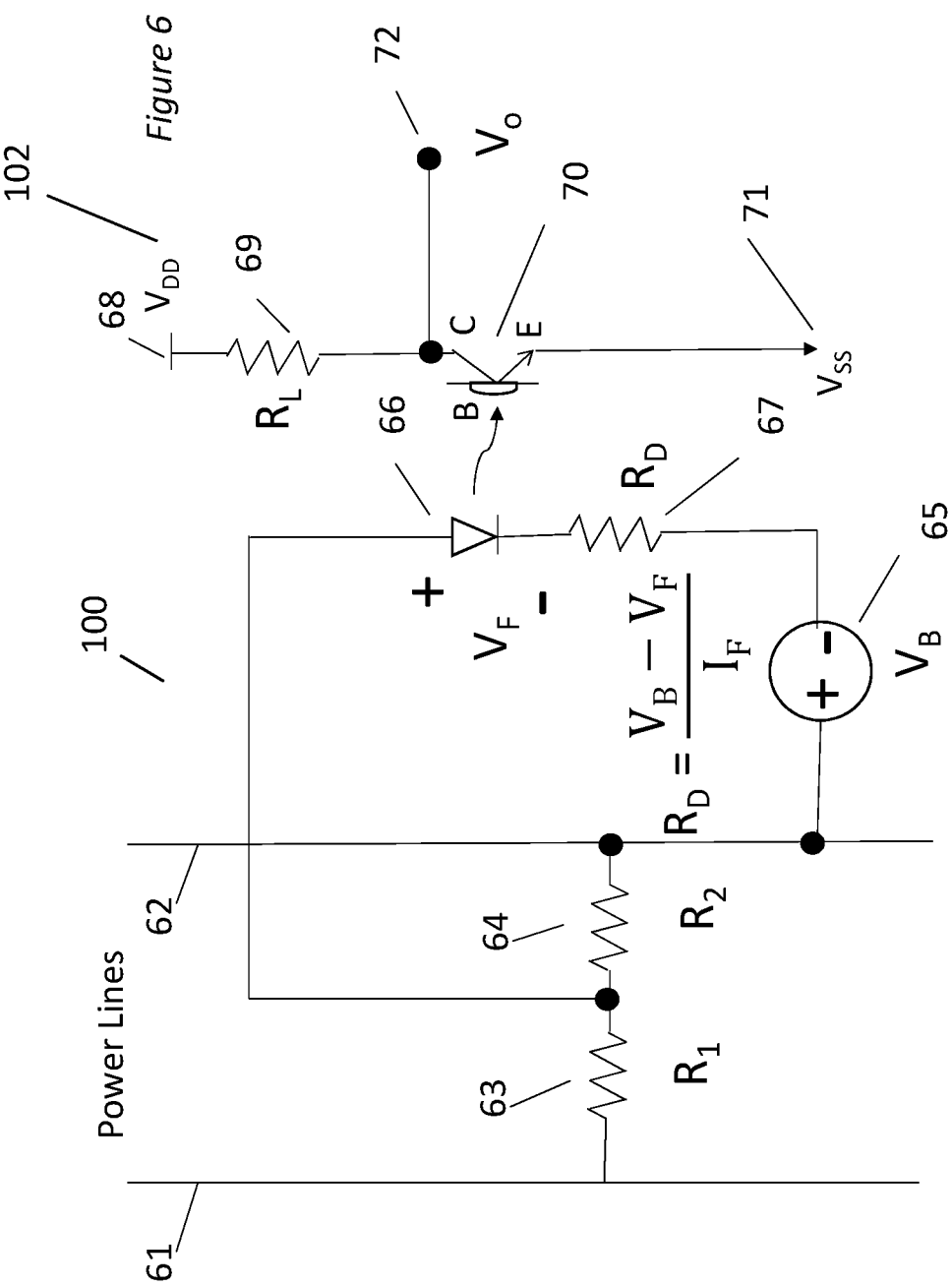
FIG. 6 is an illustration of circuit for voltage sensing transistor in an open collector configuration with a load resistor connected to the collector.

FIG. 6 is an illustration of circuit for voltage sensing transistor in the open collector configuration with a load resistor $R_L$ 69. An optical transistor 69 has a base terminal B that is optically coupled to the IF LED 66. The emitter terminal E is connected to the $V_{SS}$ terminal 71. The collector terminal C is connected to the second terminal of a resistor $R_L$ 69 in the open collector configuration. The first terminal of $R_L$ 69 is connected to the $V_{DD}$ terminal 68. The output voltage $V_O$ 72 is taken from the collector terminal C of the optical transistor 70.

FIG. 7 is an illustration of circuit for voltage and current sensing for the emitter follower configuration for a 3-phase power line application. The circuit SI1 73 senses the current of L1 phase; the circuit SV1 74, senses the voltage of L1 phase; the circuit SI2 75, senses the current of L2 phase; the circuit SV2 76, senses the voltage of L2 phase; the circuit SI3 77, senses the current of L3 phase; the circuit SV3 78, senses the voltage of L3 phase.

A smart meter system voltage and current sensing are performed as voltage drops across a shunt resistor in series with the power line or from a voltage divider connected across the power lines. These voltages are optically coupled and electrically isolated to the inputs of the low voltage circuits by using optically coupled isolators. Circuits for the voltage and current sensing method are described using resistors and optically coupled isolators. The advantages of this transformerless method as compared to the transformer approach are direct sensing of current and voltage that enables AC power and energy measurements for non-resistive loads, tamper proof for secure power measurements, compact sizes, and low costs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:
1. A method of sensing voltage within a smart meter comprising:
coupling a voltage divider to a high voltage portion of the smart meter; and
optically coupling the high voltage portion to a low voltage portion; wherein the optical coupling is provided by an infrared (IR) emitting diode on the high voltage portion and an optical transistor on the low voltage portion;

wherein the IR emitting diode and the optical transistor comprises a optically coupled isolator;

wherein a third resistor ($R_D$) coupled to the IR emitting diode provides a bias condition to the IR emitting diode; wherein the third resistor ($R_D$) is determined by the equation $$R_D = \frac{V_B - V_F}{I_F},$$

wherein $V_B$ is a bias voltage source, $V_F$ is a forward voltage of the IR emitting diode and $I_F$ is a forward current of the IR emitting diode; and wherein voltage is sensed based upon a voltage drop measured across the voltage divider.

2. The method of claim 1, wherein the IR emitting diode is biased in a forward conduction region to maximize a change in current with respect to a change of the applied forward voltage.

3. The method of claim 1, wherein the IR emitting diode operates at a forward conduction region of a current-voltage characteristic of the IR emitting diode with large gain to maximize sensitivity of the optically coupled isolator while minimizing current consumption.

4. The method of claim 1, wherein the optical transistor is in an emitter follower configuration.

5. The method of claim 4, wherein a load resistor is coupled to an emitter of the optical transistor to develop a voltage that is proportional and in phase to a sensed voltage.

6. The method of claim 1, whereas the optical transistor is in an open collector configuration.

7. The method of claim 6, wherein a load resistor is coupled to a collector of the optical transistor to develop a voltage that is proportional and in 180 degrees out of phase to a sensed voltage.

8. A system of sensing voltage within a smart meter; wherein the smart meter comprises a high voltage portion and a low voltage portion; the system comprising:
   a voltage divider coupled to a high voltage portion of the smart meter; and
   an optically coupled isolator coupled between the high voltage portion and the low voltage portion; wherein the optically coupled isolator comprises an infrared (IR) emitting diode within the high voltage portion and an optical transistor within low voltage portion; wherein a third resistor ($R_D$) coupled to the IR emitting diode provides a bias condition to the IR emitting diode; wherein the third resistor ($R_D$) is determined by the equation $$R_D = \frac{V_B - V_F}{I_F},$$

wherein $V_B$ is a bias voltage source, $V_F$ is a forward voltage of the IR emitting diode and $I_F$ is a forward current of the IR emitting diode; and wherein voltage is sensed based upon a voltage drop measured across the voltage divider.

9. The system of claim 8, wherein the IR emitting diode is biased in a forward conduction region to maximize a change in current with respect to a change of the applied forward voltage.

10. The system of claim 8, wherein the IR emitting diode operates at a forward conduction region of a current-voltage characteristic of the IR emitting diode with large gain to maximize sensitivity of the optically coupled isolator while minimizing current consumption.

11. The system of claim 10, wherein the optical transistor is in an emitter follower configuration.

12. The system of claim 11, wherein a load resistor is coupled to an emitter of the optical transistor to develop a voltage that is proportional and in phase to a sensed voltage.

13. The system of claim 8, whereas the optical transistor is in an open collector configuration.

14. The system of claim 13, wherein a load resistor is coupled to a collector of the optical transistor to develop a voltage that is proportional and in 180 degrees out of phase to a sensed voltage.

\* \* \* \* \*